United States Patent [19]

Matsuzawa et al.

[11] 4,339,301
[45] Jul. 13, 1982

[54] METHOD FOR PRODUCING A SINGLE CRYSTAL OF FERRITE

[75] Inventors: Soichiro Matsuzawa, Kuwana; Syunzo Mase, Tobishima, both of Japan

[73] Assignee: NGK Insulators, Ltd., Nagoya, Japan

[21] Appl. No.: 255,506

[22] Filed: Apr. 20, 1981

[30] Foreign Application Priority Data

May 2, 1980 [JP] Japan ................................ 55/59167

[51] Int. Cl.$^3$ .............................................. C30B 1/10
[52] U.S. Cl. ............................ 156/603; 156/DIG. 74
[58] Field of Search ....................... 156/603, DIG. 74; 252/62.56; 423/633

[56] References Cited

U.S. PATENT DOCUMENTS 3,585,088  6/1971  Schwuttke et al. ................. 156/603
3,694,269  9/1972  Bailey et al. ....................... 156/603
3,996,095  12/1976  Ahn et al. .................. 156/DIG. 74

Primary Examiner—Hiram Bernstein
Attorney, Agent, or Firm—Stevens, Davis, Miller & Mosher

[57] ABSTRACT

A single crystal of ferrite is grown toward a polycrystal of ferrite by heating a polycrystal of ferrite and a seed of single crystal of ferrite in contact with each other to effect a solid phase reaction. In this method, as the polycrystal of ferrite use is made of the specific polycrystal of ferrite prepared by using iron oxide containing iron oxide having spinel structure, iron oxide having hysteresis of spinel structure or mixture of these iron oxides in an amount of not less than 60% by weight calculated as $Fe_2O_3$ as the starting material of iron oxide of the main component of polycrystal of ferrite and the heating is effected at a temperature lower than the temperature at which the discontinuous grain growth of the polycrystal of ferrite is caused.

3 Claims, 2 Drawing Figures

METHOD FOR PRODUCING A SINGLE CRYSTAL OF FERRITE

BACKGROUND OF THE INVENTION

1. Field of the Invention

The present invention relates to a method for producing a single crystal of ferrite by bringing a polycrystal of ferrite and a single crystal of ferrite into contact and firing the contact crystals to grow the single crystal of ferrite through a solid phase reaction.

2. Description of the Prior Art

Heretofore, as the method for producing a single crystal of ferrite, Bridgman process wherein a starting material is melted at a temperature higher than the melting point of the starting material and a single crystal is grown from the molten liquid phase. But Bridgman process wherein a single crystal is grown from a liquid phase needs a high temperature higher than 1,600° C., so that in the case of production of a single crystal of ferrite using a starting material having a high vapor pressure, such as zinc oxide, the composition readily varies and impurities are readily admixed from a crucible used for melting the starting material, so that the crystallinity of the obtained single crystal is not uniform. Furthermore, Bridgeman process needs a large size of expensive complicated production apparatus and it is difficult to control the heating condition upon production and the condition for forming nucleus of single crystal, so that the mass production is difficult and therefore the obtained single crystal product comes expensive.

SUMMARY OF THE INVENTION

The present invention has been made for obviating these prior defects and problems and consists in a method for producing a larger single crystal of ferrite wherein a single crystal of ferrite which is a seed (nucleus), is contacted to a polycrystal of ferrite and the contacted crystals are fired to effect a solid phase reaction whereby a single crystal of ferrite is grown and particularly consists in a method for producing a single crystal of ferrite wherein a polycrystal of ferrite and a single crystal of ferrite are brought into contact and heated to grow the single crystal of ferrite toward the polycrystal of ferrite, characterized in that as the polycrystal of ferrite, use is made of a polycrystal of ferrite produced by usng iron oxide containing iron oxide having spinel structure and/or iron oxide having hysteresis of spinel structure in an amount of not less than 60% by weight calculated as $Fe_2O_3$ and the firing is effected at a temperature lower than the temperature at which a discontinuous grain growth of the polycrystal of ferrite is caused.

Namely, the present invention is based on the discovery attained after a large number of studies that a particularly defined polycrystal of ferrite, that is a polycrystal of ferrite having a high density and showing a discontinuous grain growth, which has been prepared by using for the starting material of iron oxide, which is the main component of ferrite, iron oxide containing iron oxide having spinel structure, that is magnetite ($Fe_3O_4$) or maghemite ($\gamma$-$Fe_2O_3$) or iron oxide having hysteresis of the above described spinel structure, that is hematite ($\alpha$-$Fe_2O_3$) produced through the above described magnetite or maghemite, or mixture thereof in an amount of not less than 60% by weight calculated as $Fe_2O_3$, is contacted to a single crystal of ferrite and the contacted ferrites are heated at a particularly defined temperature, that is a temperature lower than the temperature at which the polycrystal of ferrite causes the discontinuous grain growth, whereby the single crystal of ferrite is grown to obtain a larger single crystal of ferrite.

DESCRIPTION OF THE PREFERRED EMBODIMENT

The present invention will be explained in more detail. It has been known that the polycrystal of ferrite wherein microcrystals assemble, includes a polycrystal of ferrite showing a discontinuous grain growth as shown in FIG. 1, curve A in which when the firing temperature reaches a particularly defined temperature T° C. a part of crystal grains suddenly integrates the surrounding microcrystal grains and grows to macrocrystal grain at a far higher grain growing speed than the growing speed of the surrounding microcrystal grains, and a general polycrystal of ferrite showing a continuous grain growth as shown in FIG. 1, curve B, in which crystal grains grow continuously with raising of temperature.

In the present invention, among these polycrystals, the polycrystal of ferrite showing the discontinuous grain growth at the particularly defined temperature T° C. as shown in the curve A is used, and for the starting material of iron oxide which is the main component of polycrystal of ferrite, iron oxide containing iron oxide having spinel structure, iron oxide having hysteresis of spinel structure or mixture thereof in an amount of not less than 60% by weight calculated as $Fe_2O_3$ is used, the starting material powder for ferrite mixed with the other starting materials is shaped and fired to prepare the particularly defined polycrystal of ferrite, which is used as the polycrystal of ferrite in the present invention. Each contacting surface of the polycrystal of ferrite and the single crystal of ferrite is polished, for example, on a tin disc by means of diamond abrasive grains preferably to a roughness Rmax of less than 0.2 μm, more preferably less than 0.1 μm, both the polished surfaces are contacted directly or in the presence of a solution of an organic or inorganic acid salt containing a metal element composing the ferrite and/or an acid solution capable of dissolving partially the ferrite and both the contacted crystals are heated at a temperature which is lower than the temperature causing the discontinuous grain growth of the polycrystal of ferrite, that is a temperature lower than T° C. in FIG. 1 and near T° C. as far as possible, whereby a solid phase reaction is caused at the interface between the microcrystal grains composing the polycrystal of ferrite and the single crystal of ferrite and the microcrystal grains in the polycrystal of ferrite are integrated to the single crystal of ferrite and the single crystal of ferrite is gradually grown to form a larger single crystal of ferrite.

Figure 1:
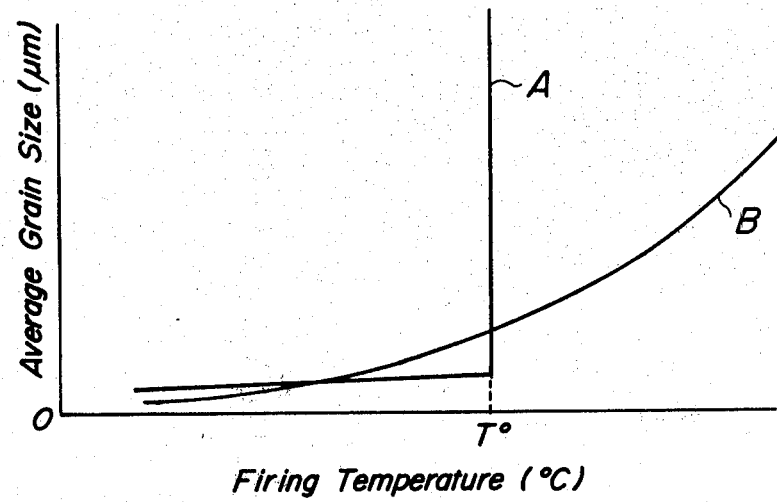
FIG. 1 is a graph showing the relation of the firing temperature to the average grain size of polycrystal of ferrite.

Thus, it is particularly important in the present invention that as mentioned above, as the polycrystal of ferrite use is made of the polycrystal of ferrite showing the discontinuous grain growth as shown in FIG. 1, curve A. which has been prepared by using iron oxide containing iron oxide having spinel structure, iron oxide having hysteresis of spinel structure or mixture thereof in an amount of not less than 60% by weight as calculated as $Fe_2O_3$ for the starting material of iron oxide and that the firing is effected at a temperature lower than T° C. shown in FIG. 1, that is at a temperature lower than the temperature at which the discontinuous grain growth of the polycrystal of ferrite occurs, to grow the single crystal.

Iron oxide having spinel structure involves magnetite $((FeO)x(Fe_2O_3)y)$ and maghemite ($\gamma$-$Fe_2O_3$) and iron oxide having hysteresis of spinel structure involves hematite ($\alpha$-$Fe_2O_3$) prepared through the above described magnetite and maghemite.

Figure 2:
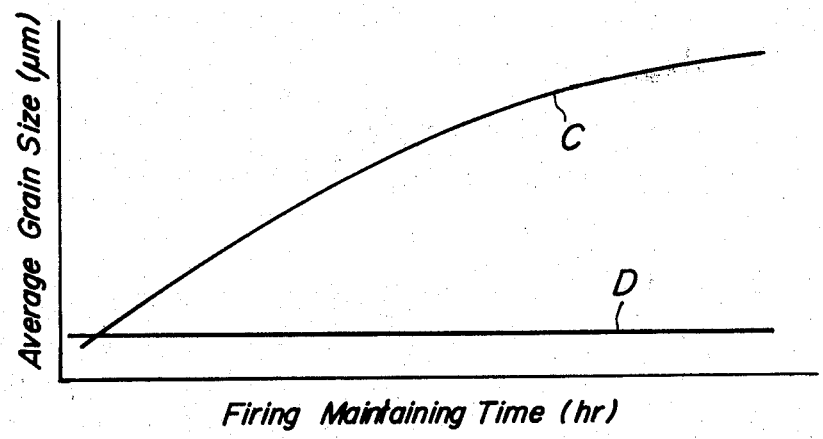
FIG. 2 is a graph showing the relation of the firing maintaining time to the average grain size of polycrystal of ferrite.

In order to grow the single crystal of ferrite toward the polycrystal of ferrite by contacting the polycrystal of ferrite to the single crystal of ferrite and heating the contacted ferrites according to the present invention, it is important that the grain size of the polycrystal of ferrite to contact to the single crystal of ferrite is fine. Because in the interface between the single crystal of ferrite and the polycrystal of ferrite, the smaller the diameter of the microcrystal grains of the polycrystal of ferrite, the smaller the curvature radius of the interface is, so that the transfer speed of the grain boundary is larger and the curvature of the interface is always negative in the single crystal side, so that particularly the single crystal of ferrite can be grown toward the polycrystal of ferrite. In this case, when the crystal grains of the polycrystal of ferrite exceed 40 ∥ m, the transfer of the boundary is substantially difficult, so that the crystal grains of the polycrystal of ferrite are preferred to be less than 40 $\mu$m. The polycrystal of ferrite showing the discontinuous grain growth as shown in FIG. 1, curve A does not substantially vary the grain size and the fine state is maintained until the temperature reaches the particularly defined temperature T° C. even if the temperature is raised and within the temperature range reaching the particularly defined temperature T° C., as shown in FIG. 2, curve D, even if the firing maintaining temperature is prolonged, the grain size does not substantially vary. On the contrary, the polycrystal of ferrite showing the continuous grain growth shows the grain growth with raising of the temperature and lapse of the firing maintaining time as shown in FIG. 1, curve B and FIG. 2, curve C.

Accordingly, in the present invention the polycrystal of ferrite showing the discontinuous grain growth in which the crystal grain is not substantially grown to the particularly defined temperature T° C. and the fine grain size is maintained as mentioned above must be used.

As mentioned above, as the polycrystal of ferrite showing the discontinuous grain growth, the polycrystal of ferrite prepared by using iron oxide containing iron oxide having spinel structure, iron oxide having hysteresis of spinel structure or mixture thereof in an amount of not less than 60% by weight calculated as $Fe_2O_3$, for the starting material of iron oxide in the production of the polycrystal of ferrite must be used. Because when polycrystal of ferrite prepared by using the other iron oxide is used, if this polycrystal of ferrite is contacted to the single crystal of ferrite and the contacted ferrites are heated to such a temperature that the single crystal of ferrite is grown, the grain growth occurs relatively rapidly and suddenly concurrently in the inner portion of the polycrystal of ferrite and the greatly grown grain inhibits the growth of the single crystal of ferrite and the single crystal of ferrite having the practically usuable size can not be obtained. Furthermore, even if iron oxide having no hysteresis of spinel structure is contained in the starting material of iron oxide, the single crystal of ferrite can be produced, but the content the above described iron oxide must be not more than 40%. If the content exceeds 40%, the obtained polycrystal of ferrite shows the continuous grain growth, so that it is substantially impossible to grow the single crystal of ferrite as mentioned above. Furthermore, even if the content is not more than 40%, as the content increases, the firing temperature when producing the single crystal of ferrite must be raised and the production condition becomes severe, so that the content is preferred to be smaller and preferably less tan 20%.

The starting material of iron oxide is preferred to be ones having a high purity and a low content of impurities, such as $SiO_2$, alkali metal oxides, alkaline earth metal oxides, $TiO_2$, $Nb_2O_5$, MgO, $Al_2O_3$ and the like and particularly the contents of $SiO_2$ and CaO are preferred to be less than 0.02% respectively. When the content of the impurities as described above is high, the porosity of the obtained polycrystal of ferrite is considerably increased and in the heating step in the production of the single crystal of ferrite, the discontinuous grain growth occurs locally in the inner portion of the polycrystal of ferrite at a temperature lower than the temperature at which the single crystal of ferrite is grown and homogeneous single crystal of ferrite can not be produced. It is preferable that the starting materials composing ferrite, such as manganese oxide, nickel oxide, zinc oxide and the like have high purity.

Iron oxide having spinel structure or iron oxide having hysteresis of spinel structure may be produced as follows. For example, a suspension of ironous hydroxide prepared by adding an alkali to an aqueous solution of ironous sulfate is oxidized by feeding air or oxygen while controlling pH at about 7 and temperature at about 80° C. to prepare magnetite ($Fe_3O_4$). Magnetite is then oxidized to prepare maghemite ($\gamma$-$Fe_2O_3$) and hematite ($\alpha$-$Fe_2O_3$). A suspension of ironous hydroxide prepared by adding an alkali to ironous sulfate is controlled at pH of about 4 and temperature of about 60° C. and air is fed thereto to prepare geothite ($\alpha$-FeOOH), which is heated in hydrogen atmosphere and hydrogenerated to prepare magnetite ($Fe_3O_4$). The obtained magnetite is oxidized to obtain maghemite ($\gamma$-$Fe_2O_3$) and hematite ($\alpha$-$Fe_2O_3$). Ironous oxalate prepared by adding oxalic acid to a solution of ironous chloride is coated in non-oxidizing atmosphere to prepare magnetite ($Fe_3O_4$). The thus formed magnetite is oxidized to prepare maghemite ($\gamma$-$Fe_2O_3$) and hematite ($\alpha$-$Fe_3O_3$).

The firing process for producing the polycrystal of ferrite may be a conventional firing method, hot press method or hot isotactic press method. It is more preferable that the above described solution exists between the containing surface of the polycrystal of ferrite and the single crystal of ferrite and this is effective for improving the activity of the interface between the microcrystal grains composing the polycrystal of ferrite and the single crystal of ferrite and promoting the occurance of the solid phase reaction.

The temperature at which the discontinuous grain growth occurs in the polycrystal of ferrite according to the present invention varies depending upon the kind of the starting material of iron oxide to be used in the production of the polycrystal of ferrite and the condition for producing the polycrystal of ferrite and the temperature at which the discontinuous grain growth is caused, is confirmed by previously carrying out the heating test.

The term "temperature lower than the temperature at which the discontinuous grain growth occurs," which is the heating temperature for bonding the polycrystal of ferrite and the single crystal of ferrite means the temperature lower than the temperature at which a part of microcrystal grains suddenly grow into macrocrystal as shown in FIG. 1, T° C. and is preferred to be a temperature within 100° C. lower than T° C. and this temperature has been confirmed by previously carrying out the heating test and is settled to a given temperature.

The following examples are given for the purpose of illustration of this invention and are not intended as limitations thereof.

EXAMPLE 1

Iron oxide which is magnetite ($Fe_3O_4$) having a purity of 99.9% and contains 0.005% of $SiO_2$, 0.005% of $TiO_2$, 0.005% of CaO and 0.01% of $Na_2O$ as impurities, which has been prepared by feeding oxygen to a suspension of ironous hydroxide prepared by adding aqueous ammonia to an aqueous solution of purified ironous sulfate while keeping pH at 7 and a temperature at about 80° C., manganese oxide and zinc oxide, each having a purity of 99.9% were compounded so that the conposition was 31 mol% of MnO, 16.5 mol% of ZnO and 52.5 mol% of $Fe_2O_3$. The resulting mixture was calcined, milled and then shaped and heated at 1,320° C. for 4 hours under equilibrium oxygen partial pressure to obtain manganese zinc ferrite polycrystal.

The polycrystal of ferrite had an average grain size of about 10 $\mu$m and a porosity of about 0.1% and the temperature starting the discontinuous grain growth was 1,360° C. From this polycrystal of ferrite and single crystal of ferrite having substantially the same composition as this polycrystal of ferrite and produced by high pressure Bridgman process, plates 15×15×5 mm and 15×15×0.5 mm were cut off respectively and each contacting surface of these plates was polished with a tin disc by means of diamond abrasive grains to a roughness Rmax of 0.05$\mu$. 6 N of $HNO_3$ solution was applied on the polished contacting surfaces and the polycrystal of ferrite plate and the single crystal of ferrite plate were superposed and heated at 1,150° C. for 30 minutes under nitrogen atmposphere and then maintained for 3 hours at a temperature of 1,350° C. which is lower than the above described temperature of 1,360° C., at which the discontinuous grain growth of polycrystal of ferrite occurs, to cause a solid phase reaction. Thus, the originally superposed polycrystal of ferrite was entirely formed into single crystal to obtain an integral single crystal of ferrite having a thickness of 5.5 mm. Another superposed ferrite plate was kept at 1,320° C. for 1 hour to obtain a polycrystal-single crystal of ferrite having a composite structure in which the originally superposed polycrystal of ferrite was formed into single crystal to 0.5 mm from the contacting surface of the single crystal of ferrite.

For comparison, when polycrystal of ferrite using hematite ($\alpha$-$Fe_2O_3$) having no hysteresis of spinel structure, which has been obtained by directly roasting ironous sulfate in air was used, in the polycrystal of ferrite no discontinuous grain growth was observed and the continuous grain growth was confirmed. When this polycrystal of ferrite was contacted to the single crystal of ferrite in the same manner as described above and heated at 1,400° C. for 4 hours, the single crystal of ferrite grew only about 0.1 mm and no single crystal of ferrite having commercially usable size was obtained.

EXAMPLE 2

Iron oxide which is magnetite ($Fe_3O_4$) and contains 0.005% of $SiO_2$, 0.005% of $TiO_2$, 0.005% of CaO and 0.005% of $Na_2O$ as impuries, which has been prepared by roasting ironous oxalate prepared by adding a solution of oxalic acid to an aqueous solution of purified ironous chloride in nitrogen gas, manganese oxide and zinc oxide, each having a purity of 99.9% were compounded so that the composition was 28 mol% of MnO, 19.5 mol% of ZnO and 52.5 mol% of $Fe_2O_3$. The resulting mixture was calcined, milled and then shaped and heated at 1,320° C. for 4 hours under equilibrium oxygen partial pressure to obtain manganese zinc ferrite polycrystal.

This polycrystal of ferrite had an average grain size of about 10 $\mu$m and a porosity of about 0.05% and the temperature starting the discontinuous grain growth was 1,380° C. From this polycrystal of ferrite and the single crystal of ferrite having substantially the same composition as this polycrystal of ferrite and produced by high pressure Bridgman process, plates 15×15×5 mm and 15×15×0.5 mm were cut off respectively and each contacting surface of these plates was polished with a tin disc by means of diamond abrasive grains to a roughness Rmax of 0.05 $\mu$m, 9 N of $HNO_3$ solution was applied on the polished contacting surfaces and the polycrystal of ferrite plate and the single crystal of ferrite plate were superposed and heated at 1,150° C. for 30 minutes under nitrogen atmosphere and then maintained for 4 hours at a temperature of 1,360° C. which is lower than the above described temperature of 1,380° C., at which the discontinuous grain growth of polycrystal of ferrite occurs, to cause a solid phase reaction. Thus, the originally superposed polycrystal of ferrite was entirely formed into single crystal to obtain an integral single crystal of ferrite having a thickness of 5.5 mm.

A polycrystal of ferrite produced by using as iron oxide hematite ($\alpha$-$Fe_2O_3$) having hysteresis of spinel structure, which has been prepared by heating magnetite under oxidizing atmosphere under the same condition as described above and a polycrystal of ferrite produced by using hematite having no hysteresis of spinel structure which has been prepared by roasting iron oxalate in air under the same condition as described above, were subjected to comparative test. In the former polycrystal of ferrite, the average grain size was about 10 $\mu$m and the porosity was about 0.1% and as the result of the heating test, the temperature starting the discontinuous grain growth was 1,380° C. When this polycrystal of ferrite and the single crystal of ferrite were superposed in the same manner as described above and heated at 1,360° C. for 4 hours, the originally superposed polycrystal of ferrite was entirely formed into single crystal. While, the latter polycrystal of ferrite having no hysteresis of spinel structure had an average grain size of about 25 $\mu$m and a porosity of about 0.2% and in the heating test, the crystal grain grew continuously and no discontinuous grain growth was observed. When this polycrystal of ferrite and the single crystal of ferrite were superposed in the same manner as described above and heated at 1,400° C. for 4 hours, the single crystal of ferrite grew only about 0.1 mm and no single crystal of ferrite having commercially usuable size was obtained.

EXAMPLE 3

Iron oxide being maghemite ($\gamma$-Fe$_2$O$_3$) and containing 0.005% of SiO$_2$, 0.003% of TiO$_2$, 0.0050% of CaO and 0.005% of Na$_2$O as impurities, which has been prepared by feeding air to a suspension of ironous hydroxide prepared by adding ammonia to an aqueous solution of ironous sulfate while keeping pH at about 4 and a temperature at 60° C. to prepare geothite ($\alpha$-FeOOH) and then drying geothite and heating dried geothite at about 350° C. in hydrogen atmosphere, manganese oxide and zinc oxide, each having a purity of 99.9% were compounded so that the composition was 35 mol% of MnO, 11 mol% of ZnO and 54 mol% of Fe$_2$O$_3$. The resulting mixture was calcined, milled and then shaped and heated at 1,320° C. for 4 hours under equilibrium oxygen partial pressure to obtain manganese zinc ferrite polycrystal.

This polycrystal of ferrite had an average grain size of about 12 $\mu$m and a porosity of 0.1% and the temperature starting the discontinuous grain growth was 1,400° C. From this polycrystal of ferrite and single crystal of ferrite having substantially the same composition as this polycrystal of ferrite and produced by high pressure Bridgman process, plates 15×15×5 mm and 15×15×0.5 mm were cut off respectively and each contacting surface of these plates was polished with a tin disc by means of diamond abrasive grains to a roughness Rmax of 0.05 $\mu$m. 6N of HNO$_3$ solution was applied on the polished contacting surfaces and the polycrystal of ferrite plate and the single crystal of ferrite plate were superposed and heated at 1,150° C. for 30 minutes under nitrogen atmpsphere and then maintained in nitrogen atmpsphere having oxygen concentration of 5% for 4 hours at a temperature of 1,370° C. which is lower than the above described temperature of 1,400° C., at which the discontinuous grain growth of polycrystal of ferrite occurs, to cause a solid phase reaction. Thus, the originally superposed polycrystal of ferrite was entirely formed into single crystal to obtain an integral single crystal of ferrite having a thickness of 5.5 mm.

For comparison, a test was made by using a polycrystal of ferrite which has been prepared under the same condition as described above by using iron oxide having no hydrosteresis of spinel structure obtained by roasting geothite ($\alpha$-FeOOH) in air. This polycrystal of ferrite had an average grain size of about 22 $\mu$m and a porosity of about 0.1% and the crystal grain grew continuously and the discontinuous grain growth was not observed. When this polycrystal of ferrite and the single crystal of ferrite were superposed in the same manner as described above and heated at 1,400° C. for 4 hours, the single crystal of ferrite grew only about 0.1 mm and the single crystal of ferrite having the commercially usuable size was not obtained.

EXAMPLE 4

Iron oxide obtained by mixing maghemite ($\gamma$-Fe$_2$O$_3$) having spinel structure, which was used in Example 3, with 35% by weight calculated as Fe$_2$O$_3$ of hematite having no hysteresis of spinel structure, which has been prepared by roasting ironous sulfate in air, manganese oxide and zinc oxide, each having a purity of 99.9% were compounded so that the composition was 29.5 mol% of MnO, 16.5 mol% of ZnO and 54 mol% of Fe$_2$O$_3$. The resulting mixture was calcined, milled and then shaped and heated at 1,320° C. for 4 hours under equilibrium oxygen partial pressure to obtain manganese zinc ferrite polycrystal.

This polycrystal of ferrite had an average grain size of 15 $\mu$m and a porosity of 0.1% and the temperature starting the discontinuous crystal grain growth was 1,420° C.

This polycrystal of ferrite and the single crystal of ferrite were superposed in the same manner as described in Example 3 and heated at 1,410° C. which is lower than the temperature causing the discontinuous grain growth of the polycrystal of ferrite, for 4 hours to cause a solid phase reaction. As the result, the originally superposed polycrystal of ferrite was entirely formed into single crystal.

For comparison, a test was made by using a polycrystal of ferrite which has been prepared by using iron oxide obtained by mixing maghemite with 45% by weight calculated as Fe$_2$O$_3$ of hematite obtained by roasting ironous sulfate in air as the starting material of iron oxide. This polycrystal of ferrite had an average grain size of about 17 $\mu$m and a porosity of about 0.2% and the heating test showed the continuous grain growth and the discontinuous grain growth was not observed. When this polycrystal of ferrite and the single crystal of ferrite were superposed in the same manner as described above and heated at 1,420° C. for 4 hours, the single crystal of ferrite grew only about 0.1 mm.

For examining the effect of the present invention, magnetic heads for VTR image were manufactured from the single crystal of ferrites produced in Examples 1, 2, 3 and 4 and the ferrite of a composite structure prepared by forming a part of polycrystal of ferrite into single crystal in Example 1, and the properties of these magnetic heads were compared with those of the magnetic head manufactured by using a single crystal of ferrite prepared by conventional Bridgman process. As the results, in the output, the former was substantially equal to the latter but in the sliding noise (S/N ratio), the former was superior by 1~3 dB to the latter and particularly the magnetic head using the ferrite of composite structure in the former, wherein a part of the polycrystal of ferrite was formed into single crystal was superior by 3 dB to that of the latter.

As mentioned above, the production of the single crystal of ferrite in the present invention is characterized in that as the polycrystal of ferrite, use is made of the polycrystal of ferrite obtained by using iron oxide containing iron oxide having spinel structure, iron oxide having hysteresis of spinel structure or the mixture thereof in an amount of more than 60% by weight calculated as Fe$_2$O$_3$, the polycrystal of ferrite is contacted to a single crystal of ferrite having substantially the same composition as the polycrystal of ferrite, and the contacted ferrites are heated at a temperature lower than the temperature at which the discontinuous grain growth of the polycrystal of ferrite is caused, to cause a solid phase reaction, whereby the single crystal of ferrite is grown toward the polycrystal of ferrite. This method can produce the single crystal of ferrite at a temperature lower than that of conventional Bridgman process wherein the single crystal of ferrite is produced from liquid phase, so that there is no problem of variation of composition due to vaporizaton of zinc oxide and the like and the single crystal of ferrite can be very simply produced by conventional firing method without needing particularly large size of complicated and expensive apparatus for producing single crystal of ferrite.

The present invention can be applied to both the soft ferrite and the hard ferrite irrelative to the composition of both the ferrites and when iron oxide having spinel structure or iron oxide having hysteresis of spinel structure is used as the starting material for producing the polycrystal of ferrite in an amount of at least 60% by weight calculated as $Fe_2O_3$, the polycrystal of ferrite showing the discontinuous grain growth can be obtained and when this polycrystal of ferrite is contacted to the single crystal of ferrite of a seed and these ferrites are heated at a temperature lower than the temperature T° C. at which the discontinuous grain growth occurs, the single crystal of ferrite is formed and as mentioned above, if the composition of the single crystal of ferrite to which the present invention can be applied, is determined, the above described temperature T° C. is particularly defined and the present invention can be very broadly applied.

According to the present invention, the polycrystal of ferrite contacted to the seed of single crystal of ferrite can be formed entirely into a single crystal of ferrite completely integrated to the seed of single crystal of ferrite and by properly selecting the heating temperature and time, the ferrite of composite structure wherein only a part of the polycrystal of ferrite is formed into single crystal and which is most suitable for core material of a magnetic head for VTR image, can be simply produced. The present invention is a method for commercially producing single crystal of ferrite in a low cost and is particularly valuable for production of ferrite core for magnetic head and is a commercially very useful method for producing single crystal of ferrite.

What is claimed is:

1. In a method for producing single crystal of ferrite in which a polycrystal of ferrite and a single crystal of ferrite are heated in contact with each other to grow the single crystal of ferrite toward the polycrystal of ferrite, the improvement comprising using as the polycrystal of ferrite a polycrystal of ferrite produced by using iron oxide containing iron oxide having spinel structure, iron oxide having hysteresis of spinel structure of mixture of these iron oxides in an amount of not less than 60% by weight calculated as $Fe_2O_3$ and effecting the heating at a temperature lower than the temperature at which the discontinuous grain growth of the polycrystal of ferrite is caused.

2. The method as claimed in claim 1, wherein the iron oxide contains not less than 80% by weight calculated as $Fe_2O_3$ of iron oxide having spinel structure, iron oxide having hysteresis of spinel structure or mixture of these iron oxides.

3. The method as claimed in claim 1 or 2, wherein impurities in the iron oxides are less than 0.02% by weight of $SiO_2$ and CaO, respectively.

* * * * *